(12) United States Patent
Lee et al.

(10) Patent No.: US 7,965,546 B2
(45) Date of Patent: *Jun. 21, 2011

(54) SYNCHRONOUS PAGE-MODE PHASE-CHANGE MEMORY WITH ECC AND RAM CACHE

(75) Inventors: Charles C. Lee, Cupertino, CA (US); Frank I-Kang Yu, Palo Alto, CA (US); David Q. Chow, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/579,695

(22) Filed: Oct. 15, 2009

(65) Prior Publication Data

US 2010/0027329 A1 Feb. 4, 2010

Related U.S. Application Data

(63) Continuation-in-part of application No. 11/748,595, filed on May 15, 2007, now Pat. No. 7,471,556, and a continuation-in-part of application No. 11/740,398, filed on Apr. 26, 2007, now abandoned, and a continuation of application No. 11/769,324, filed on Jun. 27, 2007, now Pat. No. 7,606,111.

(51) Int. Cl.
*G11C 11/00* (2006.01)

(52) U.S. Cl. ........... 365/163; 365/238.5; 365/200
(58) Field of Classification Search ........... 365/163, 365/238.5, 200
See application file for complete search history.

(56) References Cited

U.S. PATENT DOCUMENTS 7,471,556 B2 * 12/2008 Chow et al. ............ 365/163
7,606,111 B2 * 10/2009 Lee et al. ............ 365/238.5

* cited by examiner

*Primary Examiner* — Huan Hoang
(74) *Attorney, Agent, or Firm* — Stuart T. Auvinen; g Patent LLC

(57) ABSTRACT

Phase-change memory (PCM) cells store data using alloy resistors in high-resistance amorphous and low-resistance crystalline states. The time of the memory cell's set-current pulse can be 100 ns, much longer than read or reset times. The write time thus depends on the write data and is relatively long. A page-mode caching PCM device has a lookup table (LUT) that caches write data that is later written to an array of PCM banks. Host data is latched into a line FIFO and written into the LUT, reducing write delays to the relatively slow PCM. Host read data can be supplied by the LUT or fetched from the PCM banks. A multi-line page buffer between the PCM banks and LUT allows for larger block transfers using the LUT. Error-correction code (ECC) checking and generation is performed for data in the LUT, hiding ECC delays for data writes into the PCM banks.

9 Claims, 15 Drawing Sheets

US 7,965,546 B2

SYNCHRONOUS PAGE-MODE PHASE-CHANGE MEMORY WITH ECC AND RAM CACHE

RELATED APPLICATION

This application is a continuation of U.S. Ser. No. 11/769,324 filed Jun. 27, 2007, now U.S. Pat. No. 7,606,111, which is a continuation-in-part (CIP) of the co-pending application for "Local Bank Write Buffers for Accelerating a Phase-Change Memory", U.S. Ser. No. 11/748,595 filed May 15, 2007, now U.S. Pat. No. 7,471,556. This application is also a CIP of "Fast Suspend-Resume of Computer Motherboard Using Phase-Change Memory", U.S. Ser. No. 11/740,398, filed Apr. 26, 2007.

FIELD OF THE INVENTION

This invention relates to phase-change memories, and more particularly to page-mode and caching phase-change memories.

BACKGROUND OF THE INVENTION

Main memories often use dynamic-random-access memory (DRAM), while faster cache memories and on-chip memories may use static random-access memory (SRAM). Read-only-memory (ROM) may use fuses or masked metal options, or may use electrically-erasable programmable read-only memory (EEPROM) cells. These are randomly-accessible memories since individual words can be read or written without disturbing nearby data. Often individual bytes may be written.

Mass storage memory is block-addressable, where a block of 512 or more bytes must be read or written together as a block. Individual words of 64 bytes or less cannot be separately written without re-writing the whole 512-byte block. Mass storage devices include rotating magnetic disks, optical disks, and EEPROM arranged as flash memory.

Traditionally, flash memory has been used for non-volatile storage. Another kind of non-volatile memory, phase-change memory, was discovered in the 1960's, and was even written about in a paper in Electronics magazine in September 1970 by the founder of Intel Corp., Gordon Moore. However, despite the long-felt need, this 40-year-old technology has not yet been widely used in personal computers and other systems.

Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

One problem with phase-change memory is that write times are data-sensitive. Writing a 1 into a PCM cell may require 100 ns, while writing a 0 to a PCM cell may require only 5 or 10 ns. The cell read time may be relatively short, such as 2-10 ns. Thus writing a 1 to a cell may require 10 times longer than writing a 0 to the cell. This write asymmetry can increasing delays that can be mitigated with improved buffering and bank interleaving.

What is desired is a phase-change memory that compensates for asymmetric write times through improved buffering and caching. A phase-change memory designed for data-sensitive write delays is desired. A memory system that has the high storage density of phase-change memory yet has the rapid access time of a RAM is desirable. A page-mode phase-change memory with a page buffer and a look-up table cache for improved performance is also desirable.

DETAILED DESCRIPTION

The present invention relates to an improvement in phase-change memory systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Phase-Change Memory—FIGS. 1-4

Figure 1:
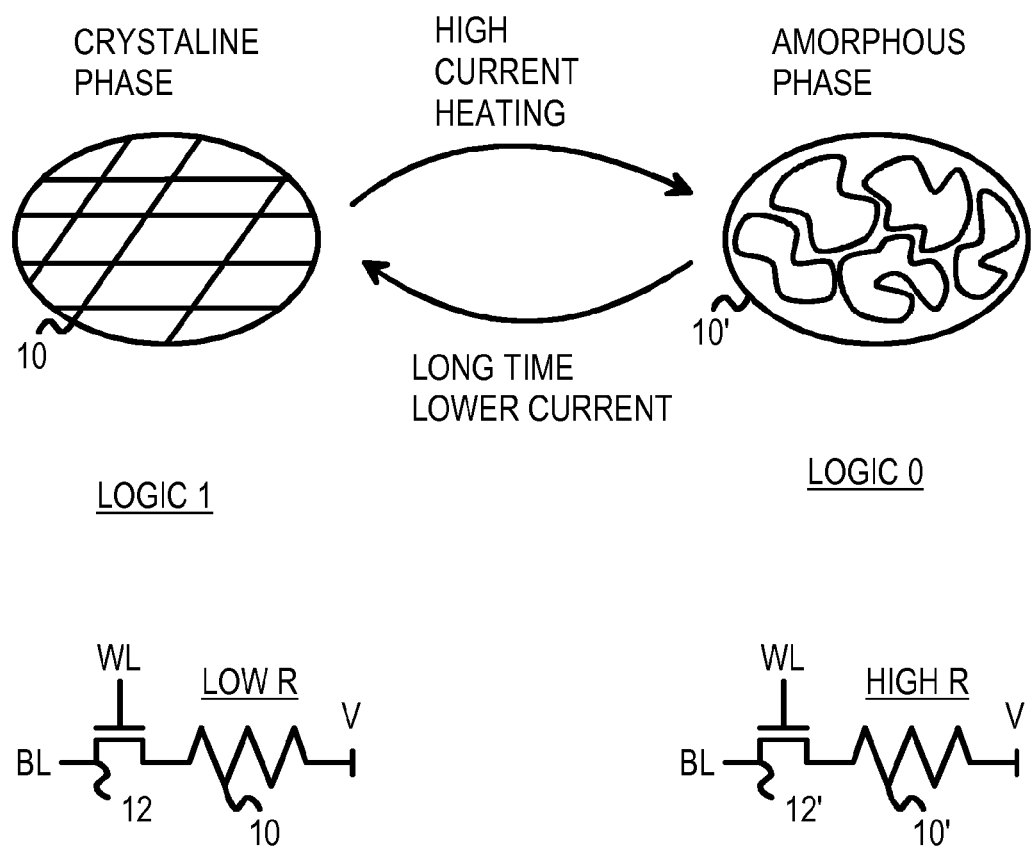
FIG. 1 shows a phase-change memory cell.

FIG. 1 shows a phase-change memory cell. Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

In FIG. 1, when alloy resistor 10 is in the crystalline state, its resistivity is low. The crystalline state represents a logic high or 1. A PCM memory cell has alloy resistor 10 in series with select transistor 12 between a bit line BL and a voltage V. When V is a low voltage such as ground, and word line WL is driven high, the bit-line voltage is pulled from a high pre-charged state to ground through select transistor 12 and alloy resistor 10 due to the low resistance of alloy resistor 10.

When alloy resistor 10' is in the amorphous state, its resistivity is high. The amorphous state represents a logic low or 0. Another PCM memory cell has alloy resistor 10' in series with select transistor 12' between a bit line BL and a voltage V. When V is a low voltage such as ground, and word line WL is driven high, the bit-line voltage remains in its high or pre-charged state, since the high resistance of alloy resistor 10' limits current through select transistor 12'.

Note that the assignment of logical 0 and logic 1 states to the crystalline and amorphous states is arbitrary. The crystalline state could be assigned logical 1 or logical 0, with the amorphous state having the opposite logical value.

Alloy resistor 10 may be a small layer that is integrated with select transistor 12, such as a layer over or near the source terminal of transistor 12. Alternately, alloy resistor 10 may be a separate resistor device, such as a patterned line or snaking line between the source of select transistor 12 and ground.

When a high current is passed through alloy resistor 10, the alloy can transform from the crystalline state into the amorphous state. The high current creates resistive heating in alloy resistor 10 and the melting temperature is rapidly reached, causing the crystal to melt into a liquid. Upon rapid cooling, alloy resistor 10 solidifies into the amorphous state since there is little time for crystals to grow during cooling.

When a lower current is passed through alloy resistor 10 for a long period of time, the crystalline temperature is reached or exceeded. However, the current is not sufficient to cause the higher melting temperature to be reached. The amorphous alloy begins to crystallize over this long time period. For example, small crystal domains within the amorphous state may grow and absorb other domains until alloy resistor 10 contains one or just a few crystal domains.

Thus alloy resistor 10' transforms from the high-resistance amorphous state into the low-resistance crystalline state by applying a moderate current for a relatively long period of time, allowing the crystal to grow at the crystalline temperature. Alloy resistor 10 transforms from the low-resistance crystalline state into the high-resistance amorphous state by applying a high current for a relatively short period of time, allowing the crystal to melt into an amorphous blob at the melting temperature.

Figure 2:
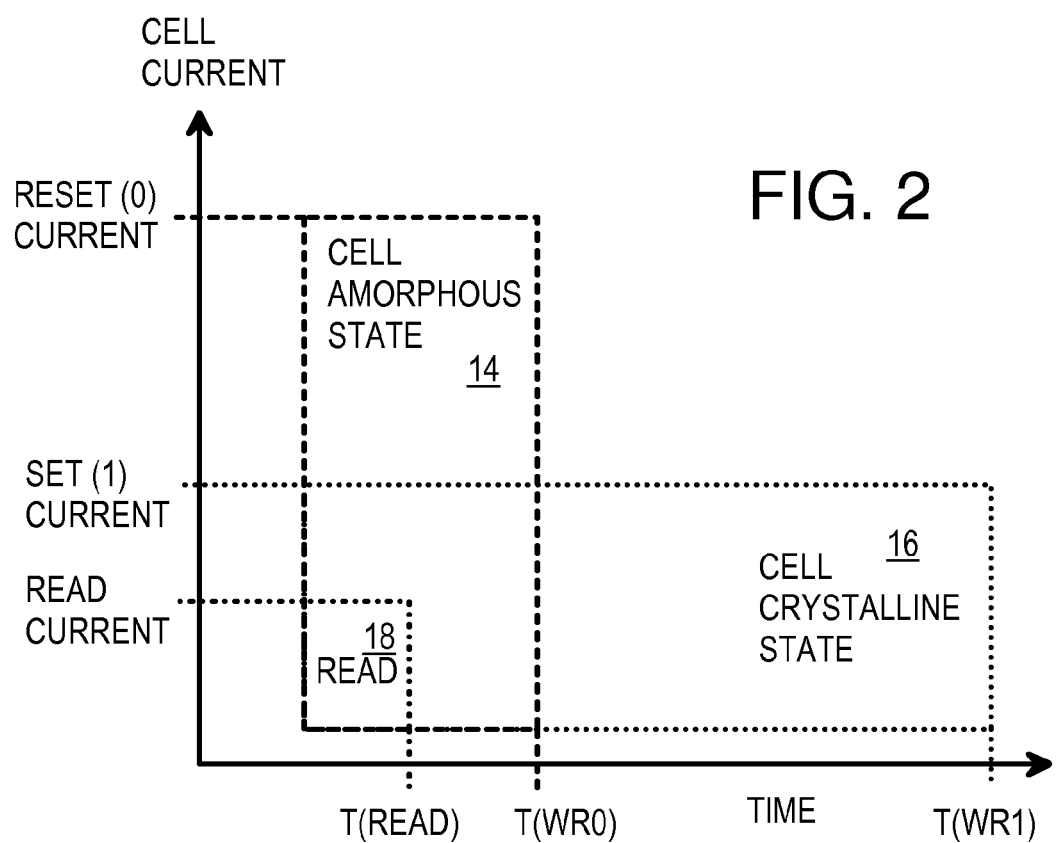
FIG. 2 is a graph of current and time to transform states in a phase-change memory cell.

FIG. 2 is a graph of current and time to transform states in a phase-change memory cell. Amorphous state 14 is reached when a high current (the reset current) is applied for a time of T(WR0). Crystalline state 16 is reached when a moderate current, the set current, is applied for a longer period of time T(WR1). These states are retained when currents below the moderate current are applied, or when currents are applied for short periods of time. State transformations, or partial state transformations, may occur when the full currents and times are not both met, such as applying the set current for less than the set time. These partial state transformations are undesirable.

The PCM cell can safely be read by applying a lower read current for a short period of time. For example, the read current can be less than either the set or reset currents. Reading 18 has the read current applied for less than the set or reset times, T(WR1), T(WR0), respectively. For example, the read time T(READ) can be less than half of the reset time, and the read current can be less than half of the set current. The reset current can be double or more the set current, and the set time can be double, triple, 5×, or more of the reset time.

Since the set time T(WR1) is so much longer than the reset time T(WR0), the time to write a memory cell is dependent on the data itself. Since data often contains both 1's and 0's, both setting and resetting can occur for the same data word. The reset time can overlap with the longer reset time, allowing both set and reset to overlap in time. Then the overall write time is determined by the longer set period of time.

Figure 3:
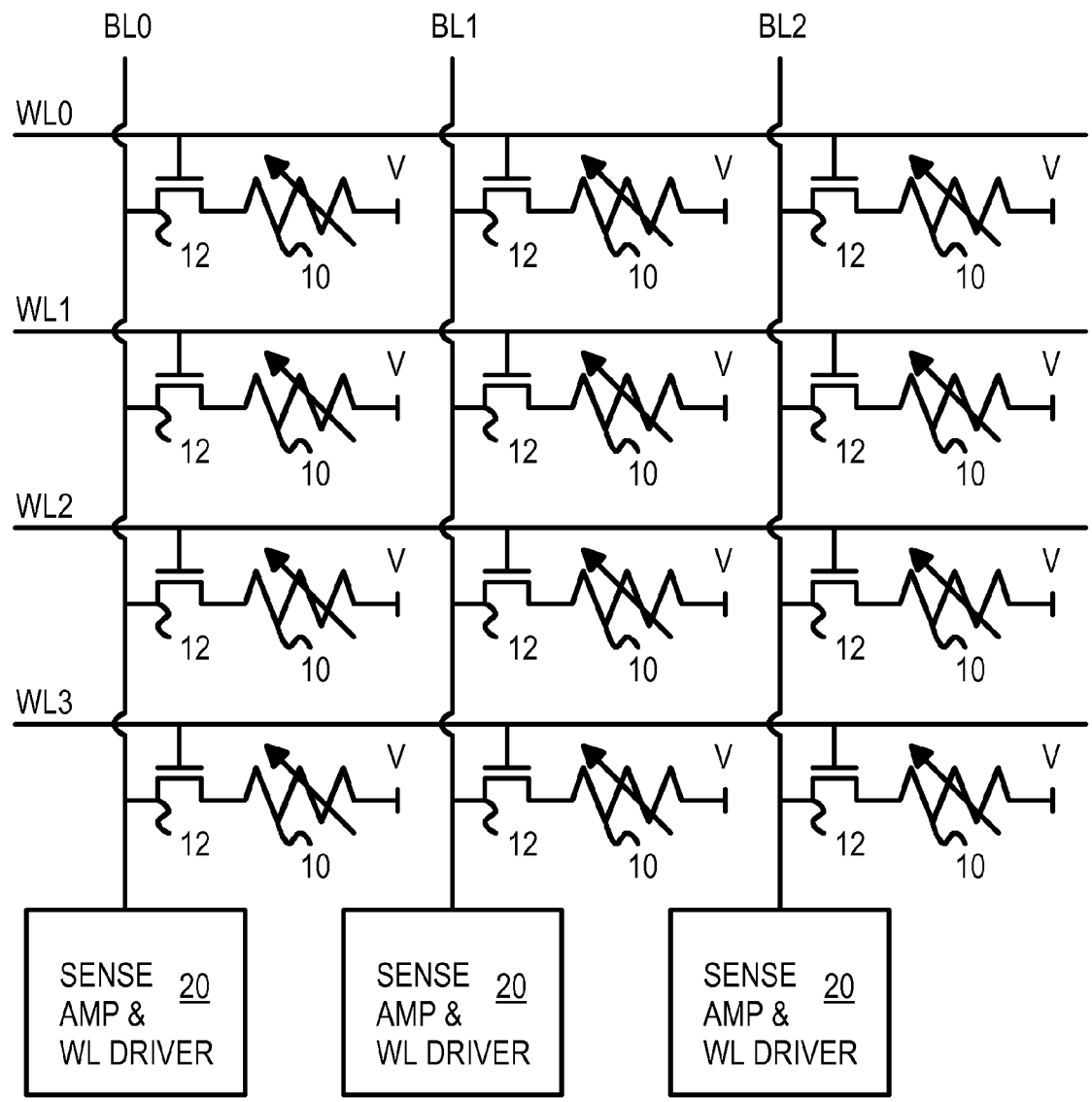
FIG. 3 shows an array of phase-change memory cells.

FIG. 3 shows an array of phase-change memory cells. Word lines WL0:3 are applied to the gates of select transistors 12, while bit lines BL0:2 connect to the drains of select transistors 12. Alloy resistors 10 are in series between the sources of select transistors 12 and a cell voltage V, which could be ground, power, or some other voltage, and could be switched on and off, such as for power down or to disable an array or block.

Alloy resistors 10 each can be in a high-resistance amorphous state, or in a low-resistance crystalline state. The current drawn from a bit line by select transistor 12 and alloy resistor 10 in the selected word line (row) is sensed by sense amplifiers 20 and amplified and buffered to generate the data read from the cell. The current drawn through alloy resistor 10 is less than or equal to the read current.

During writing, sense amplifiers 20 activate bit-line drivers that drive the set or reset current onto the bit lines and through the selected alloy resistor. After the current is applied for the set or reset time, alloy resistor 10 is transformed into the new state, either the amorphous or crystalline state. One cell per column is written, since only one of the word lines is activated at a time. Columns being written into the 0 state have the reset current applied to the bit line for the reset time period, while columns being written into the 1 state have the set current applied for the set time period.

Figure 4:
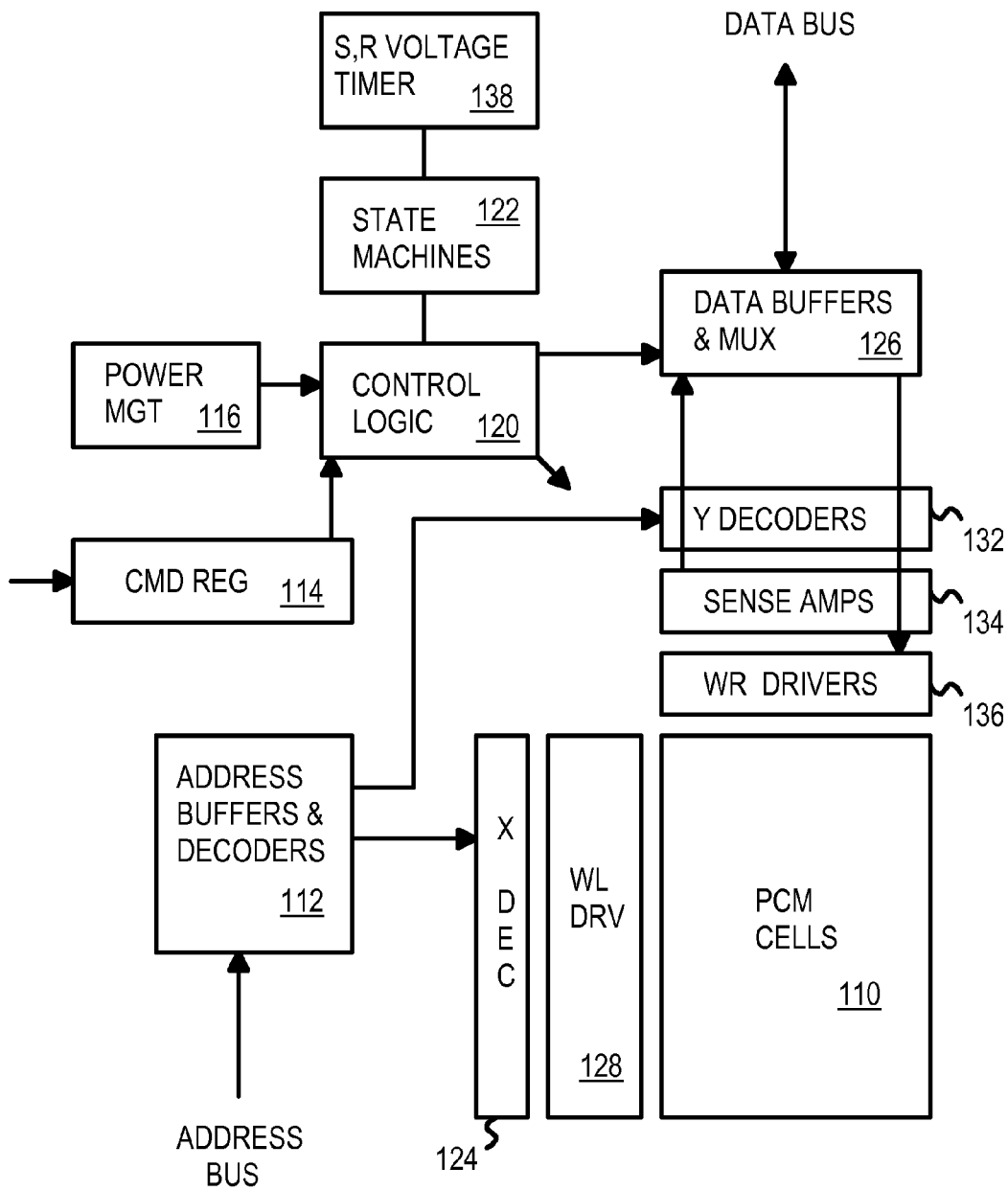
FIG. 4 shows a phase-change memory.

FIG. 4 shows a phase-change memory. A PCM chip may include some or all of the blocks shown in FIG. 4, and other blocks, or some of the functions may be performed by a separate PCM controller.

PCM cells 110 form an array of rows and columns of select transistors and alloy resistors that change between crystalline and amorphous phase states. The high and low resistance values of the 2 phase states are sensed by sense amplifiers 134 when a read current is drawn through a selected row of PCM cells. Word line drivers 128 drives one row or word line in PCM cells 110 while the other rows are disabled. A row portion of an address applied to address decoder 112 is further decoded by X decoder 124 to select which row to activate using word line drivers 128.

A column portion of the address applied to address decoder 112 is further decoded by Y decoder 132 to select a group of bit lines for data access. Data buffers 126 may be a limited width, such as 64 bits, while PCM cells may have a larger number of bit lines, such as 8×64 columns. One of the 8 columns may be selected by Y decoder 132 for connection to data buffers 126.

During writing, external data is collected by data buffers 126 and applied to write drivers 136. Write drivers 136 generate voltages or currents so that the set currents are applied to bit lines for PCM cells that are to be written with a 1, while higher reset currents are applied to bit lines for PCM cells to be reset to 0.

Set, reset voltage timer 138 includes timers that ensure that the set currents are applied by write drivers 136 for the longer set period of time, while the reset currents are applied for the shorter reset time period, and write drivers 136 for reset PCM cells are disabled after the reset time period. Both set and reset currents could be applied at the same time, such as for a period that the reset pulse overlaps the longer set pulse. Alternately, set and reset pulses could be non-overlapping. This may reduce peak currents, but increase write time. Since the reset time is perhaps one-tenth of the set time, write delays may increase by 10% or so.

State machines 122 can activate set, reset voltage timers 138 and cause control logic 120 to disable write drivers 136 after the set and reset time periods have expired. State machines 122 can generate various internal control signals at appropriate times, such as strobes to pre-charge bit lines and latch sensed data into data buffers 126.

Command register 114 can receive commands that are decoded and processed by control logic 120. External control signals such as read/write, data strobes, and byte enables may also be received in some embodiments. Command register 114 may be replaced by a command decoder in some embodiments. Power management unit 116 can power down blocks to reduce power consumption, such as when the PCM chip is de-selected. Since PCM cells 110 are non-volatile, data is retained when power is disconnected.

There may be several arrays of PCM cells 110 and associated logic on a large PCM chip. An array-select portion of the address can be decoded by address decoders 112 to enable one of the many arrays or blocks on the PCM chip.

Applications—FIG. 5

Figure 5A:
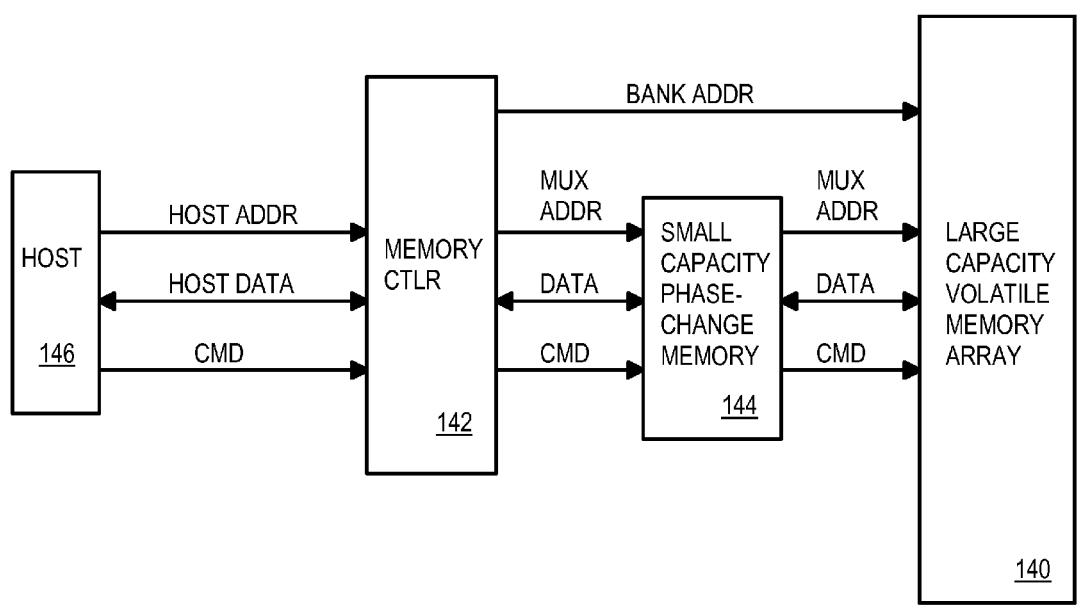
FIG. 5A shows a page mode caching PCM that acts as a cache to a larger-capacity volatile memory.

FIG. 5A shows a page mode caching PCM that acts as a cache to a larger-capacity volatile memory. Host 146 generates commands for host data and host addresses that are sent to memory controller 142. Memory controller 142 examines the host address and partially decodes the host address to generate bank select signals that select banks in large memory array 140. Large memory array 140 is a volatile memory array such as an array of DRAM chips, but the access time for large memory array 140 may be slower than the access time of small PCM 144.

Small PCM 144 can act as a cache of data stored in larger memory array 140. Memory controller 142 generates a multiplexed address from the host address, and arranges the host data and command to send to small PCM 144. When small PCM 144 does not store the requested data, the request is forwarded on to large capacity memory 140. However, when small PCM does store a copy of the requested data, then small PCM 144 can respond to the host's request, usually much faster than larger memory array 140. For writes, small PCM 144 can be write-through, forwarding all writes to larger memory array 140, or write-back (copy-back), storing the host write data and only writing back to larger memory array 140 when a line is being removed or replaced from small PCM 144.

Figure 5B:
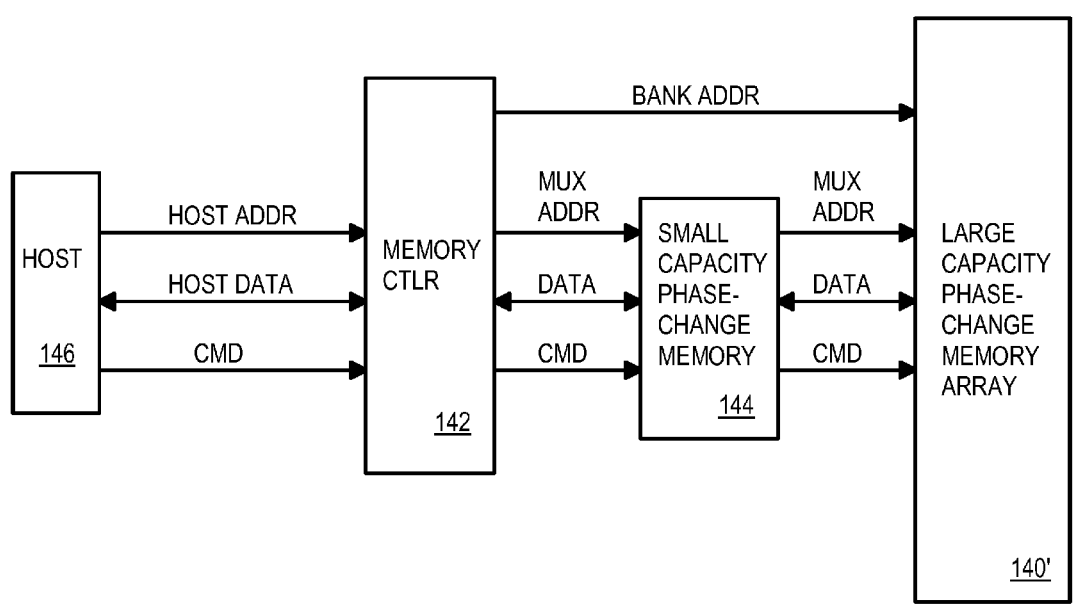
FIG. 5B shows using phase-change memory for both smaller cache and larger-capacity memories.

FIG. 5B shows using phase-change memory for both smaller cache and larger-capacity memories. Memory controller 142 can be modified to access larger PCM array 140', generating PCM commands and signals rather than DRAM commands such as RAS and CAS. Multiplexed addresses may still be used to reduce the external pins needed by PCM chips. Since larger PCM array 140' is constructed from PCM chips that are non-volatile rather than from DRAM chips which are volatile, data can be retained in larger PCM array 140' when power is lost. Small PCM 144 can still act as a cache, since a smaller array is often faster to access than a larger array of the same kind or memory chips.

Figure 6A:
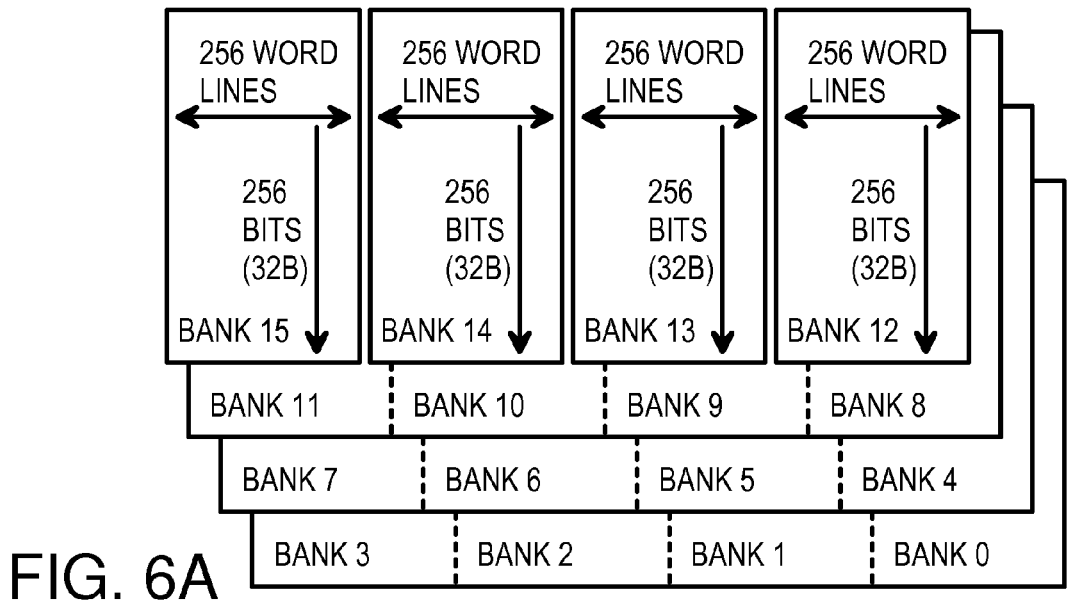
FIG. 6A shows an array of interleaved phase-change memory.

FIG. 6A shows an array of interleaved phase-change memory. A 1 mega-bit memory is arranged as 16 banks, with each bank having 1M/16=64K bits. Each of the 16 banks has 256 word lines (rows) and 256 bit lines. The 256 bit lines can be arranged as 32 1-byte columns. Dividing the PCM memory array into a large number of banks can improve performance especially for PCM since slow asymmetric write operations in one bank can occur independently of other operations in other banks. Each bank can be provided with its own write latch to store data being slowly written into that bank such as by setting and resetting the alloy resistors in the PCM cells.

Figure 6B:
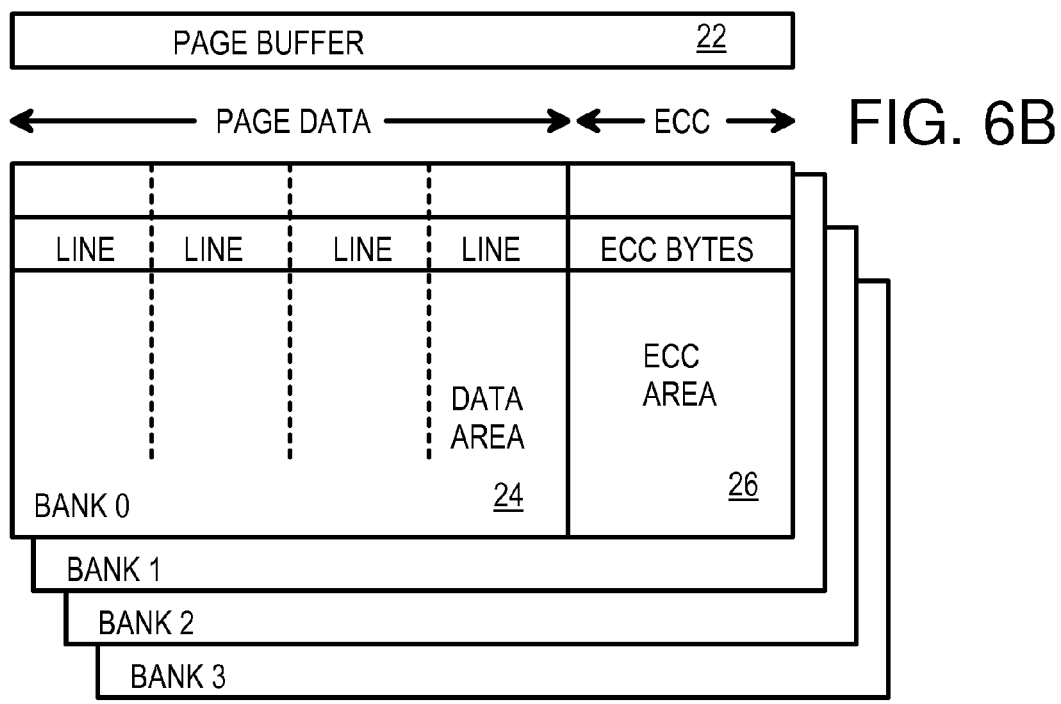
FIG. 6B shows a PCM bank that is divided into pages and lines.

FIG. 6B shows a PCM bank that is divided into pages and lines. Each of the interleaved banks of PCM in FIG. 6A can be further sub-divided into pages and lines. A page can be a row of data in a bank, while each page contains multiple lines. For example, a page could be 256 bits (32 bytes), and each line could be 8 bytes, for pages with 4 lines per page. Other page and line sizes could be substituted, and multi-row pages or multiple pages per row could be used, or multi-bank pages, etc.

Error correction information may also be appended to the host data. A bank of PCM may include data area 24 where host data is stored, and ECC area 26 where error-correction code (ECC) generated from the host data is stored. Both the stored host data and the ECC bytes can be read from the PCM chips and latched into page register 22. The host data and ECC bytes in page register 22 may then be used to calculate error correction information, such as by generating a Reed-Solomon syndrome that specifies locations of errors and allows for error repair. More complex multi-bit errors may be uncorrectable yet still reported by the error corrector.

Figure 7:
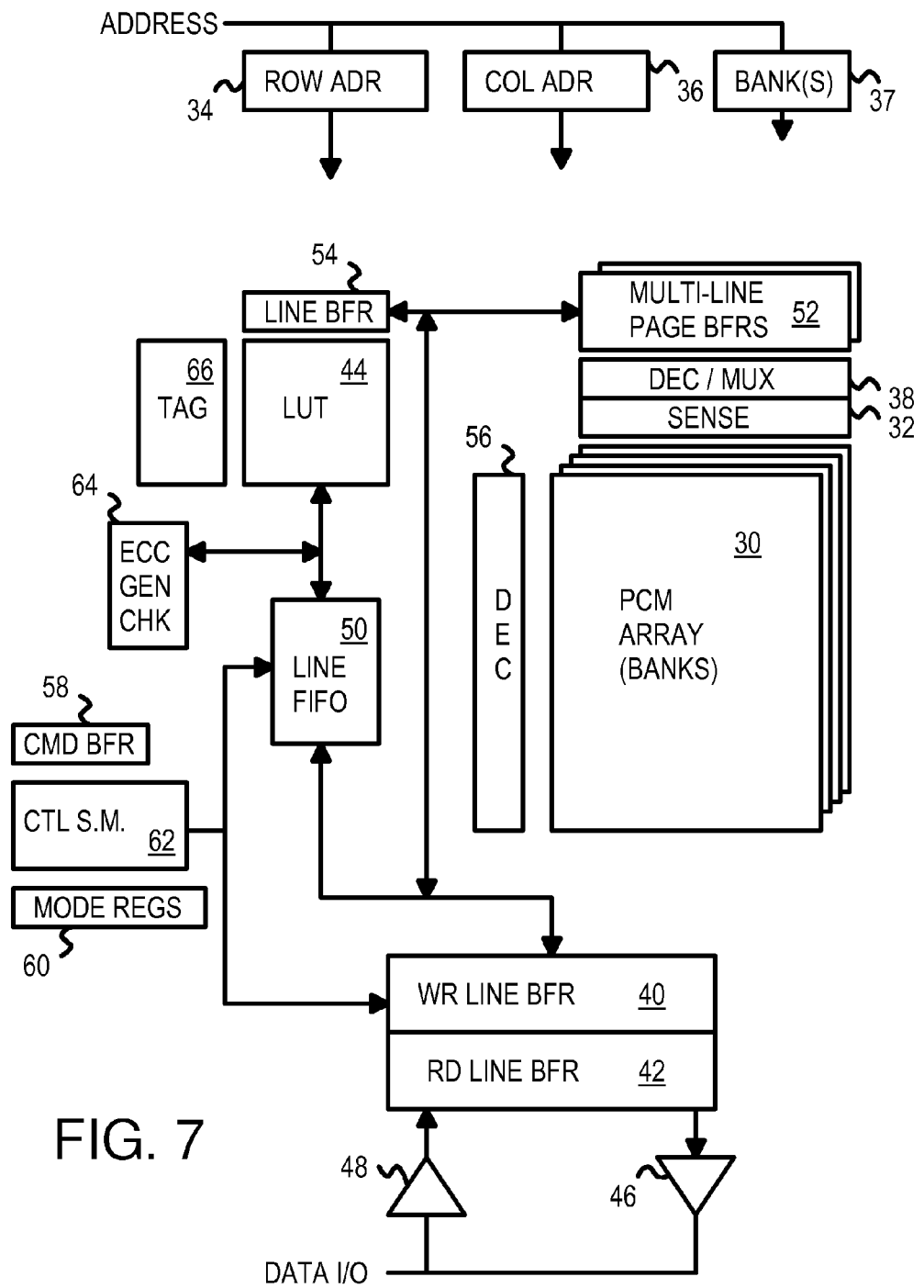
FIG. 7 is a block diagram of a page-mode caching phase-change memory device.

Block Diagram—FIG. 7

FIG. 7 is a block diagram of a page-mode caching phase-change memory device. The PCM device of FIG. 7 may be used as small PCM 144 of FIGS. 5A, 5B or in other applications such as a stand-alone memory device, or a device in an array of memory devices.

The input address is divided into 3 parts. The upper 8 address bits in row decode buffer 34 are applied to row decoders to each of PCM banks 30. The row decoders select one of the 256 word lines in each bank of PCM banks 30.

The middle 5 address bits in column decode buffer 36 are applied to column decoders to each of PCM banks 30. The column decoders select one of the 32 byte-wide columns of bits lines in each of PCM banks 30.

The lower address bits in bank-address buffer 37 select one or more of the PCM banks for access. Additional logic, such as control logic or address sequencing logic (not shown), may alter the address bits in bank-address buffer 37 to activate several of PCM banks 30 at the same time to write in multiple bytes at a time.

Each PCM bank 30 in the PCM array has row decoder 56 and column decoder and muxing 38 to select one byte of memory cells for reading or writing. Sense amplifiers 32 each sense pairs of bit lines that connect to memory cells to read bits of data. The read data can be latched or buffered by multi-line page buffers 52 before being transferred over data lines to read line buffer 42. Read data from read line buffer 42 is driven off-chip by output buffers 46.

Write data enters the PCM chip through input buffers 48 and are stored in write line buffers 40. Write line buffers 40 can be one or more line buffers, such as four buffers of 4 bytes per buffer when lines are 4 bytes. The width each buffer in write line buffers 40 can match the width of data lines to multi-line page buffers 52. When the width of the external Data I/O differs, two or more external bus cycles may be needed to fill each 4-byte buffer in write line buffer 40. For example, a 16-bit external data bus requires 2 bus cycles to fill each 4-byte buffer in write line buffers 40, while a 32-bit external bus requires only 1 bus cycle.

Each of PCM banks 30 may also contain a local bank write latch. The bits lines in each PCM bank 30 may then be driven by write drivers from the data in the bank write latch. Once the data is latched and stored in the local bank write latch, data for a different bank in PCM banks 30 may be sent over the data lines between PCM banks 30 and multi-line page buffers 52.

Since the data is stored locally with each bank, the slow set-write process can occur concurrently with data transfers to other banks. Data throughput for slow phase-change writes into the crystalline state is vastly improved by local write-data storage at the interleaved banks. Sufficient time for growing crystals in the alloy resistors is provided without blocking other writes and data transfers.

However, data access of PCM banks 30 may still be relatively slow, especially for writes that require re-crystallization of the alloy resistors. A small cache lookup table (LUT) may be provided to speed up accesses. Data from write line buffer 40 may be sent to line FIFO 50 for writing into LUT 44, rather than being written directly into PCM banks 30. Tags 66 can store address tags for lines of data stored in LUT 44, and during reads data can be provided from LUT 44 to read line buffer 42 when a hit occurs in tags 66.

LUT 66, tags 66, line buffer 54, multi-line page buffers 52, and line FIFO 50 can be small static random-access memories (SRAM) or registers or other hardware memory. They could be partitions of a larger SRAM array, or could be separate physical blocks of memory on a PCM device.

When a line in LUT 44 is to be evicted to make space in LUT 44 for new data, the old line is sent to line buffer 54, and then transferred to multi-line page buffers 52 for writing into PCM banks 30. When data is allocated to LUT 44, the old data is read from PCM banks 30 into multi-line page buffers 52, and then written into LUT 44, either through line FIFO 50 or line buffer 54 or directly.

ECC controller 64 can generate ECC bytes for host data from line FIFO 50 that is being stored in LUT 44, and can also check data fetched from PCM banks 30 for errors, and correct any errors when the fetched data is being written into LUT 44, or after the data has been written into LUT 44.

Commands from the host or external memory controller may be sent to the PCM device and latched into command buffer 58. Configuration and other mode data may be written into mode registers 60. Control state machine 62 performs a sequence of internal operations that are needed to perform the command in command buffer 58. Several such sequences are shown later in FIGS. 10-14. Fairly complex logic and multiple levels of state machines may be used for control of the many buses and blocks in a PCM device.

Figure 8:
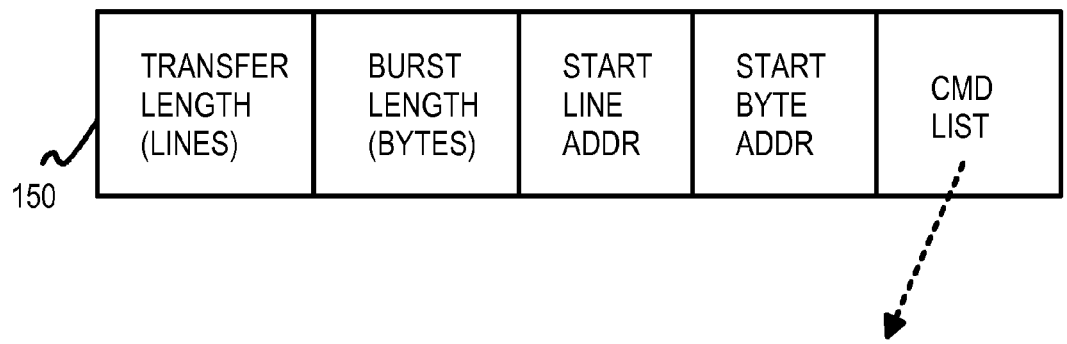
FIG. 8 shows a mode register on a PCM device.

FIG. 8 shows a mode register on a PCM device. Mode register 150 may correspond to mode register 58 of FIG. 7, or may be a subset or a super set of implemented mode-register, command register, or other register features.

A variety of commands in a command list may be processed by the PCM device. Block moves may require that a transfer length and a start address be programmed into mode register 150. The start address may be aligned to line boundaries, and require only a start line address, or may be mis-aligned, requiring both a start line address and a start byte address, or a byte offset within the start line address. A burst length may also be programmed into mode register 150. The burst length may be set by the host.

Commands that may be processed may include a block move, a burst-mode write, a burst-mode read, a line ECC read with verify, a line ECC write with verify, a write to the LUT in either copy-back or write-through modes, and a mode register load. Other commands may also be supported, and various extensions of these commands may be supported in some embodiments. The page-mode architecture with LUT 44, multi-line page buffers 52, read and write line buffers 42, 40, line FIFO 50, and line buffer 54 provide flexible hardware for a wide variety of commands that may be processed by the page-mode PCM device.

Figure 9:
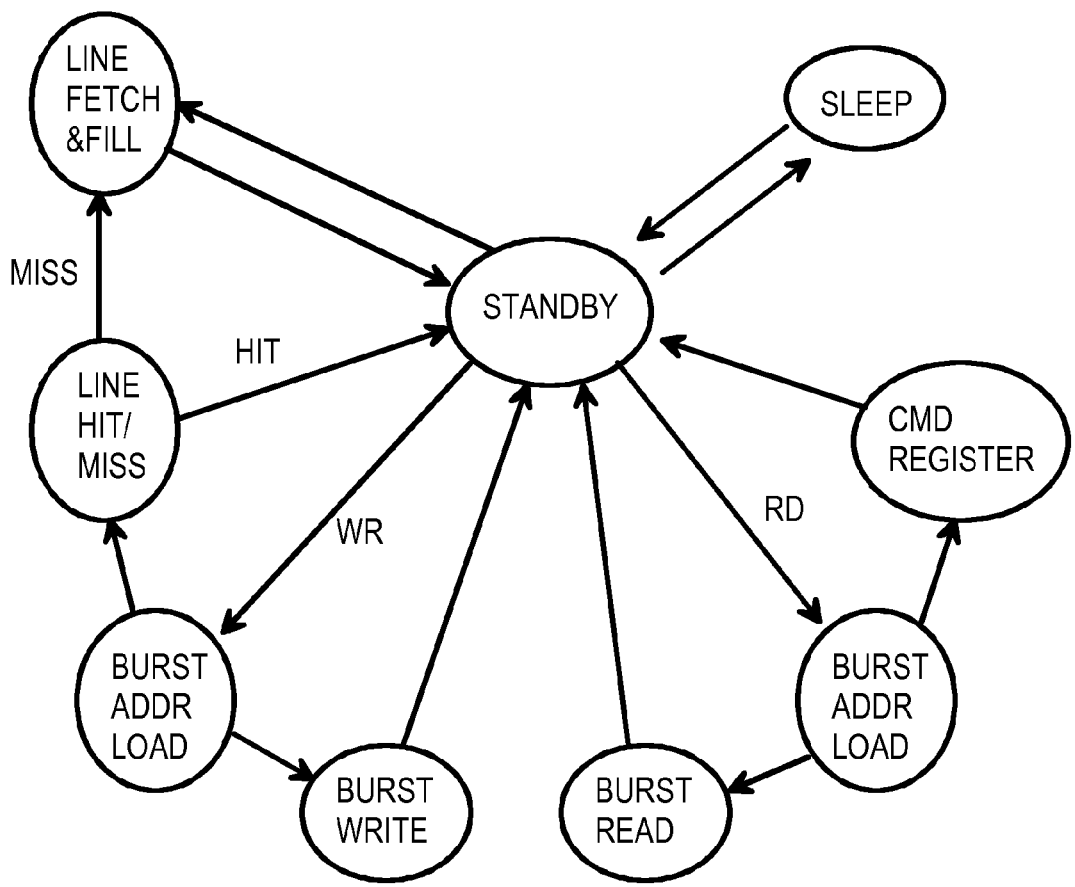
FIG. 9 is a state diagram of states of the page-mode PCM device for various commands being processed.

FIG. 9 is a state diagram of states of the page-mode PCM device for various commands being processed. The standby state is active when no operations are being processed. The PCM device can enter a sleep state to reduce power consumption. The sleep state can be entered in response to a sleep command, or could be entered automatically when no commands are received for a period of time.

When a write command is processed, the PCM device exits the standby state and enters the write burst-address-load state. The address is received and the data is received from the host over several clock cycles of a burst write. The data is internally transferred from the write line buffer to the line FIFO or to the multi-line page buffers during the burst write state.

When the LUT is active, the tags can be checked for a hit or miss in the hit-miss state. When the tags match, a hit occurs, and the write data can be loaded directly into the LUT. When the tags don't match, a miss occurs, and an old line must be removed from the LUT to make room for the new line that stores the host-write data. The old line is copied back to the PCM banks and data from the PCM banks for the new line is fetched during the line fetch and refill state. The host data can be merged with the fetched-line data in the LUT.

When a read command is processed, the PCM device exits the standby state and enters the read burst-address-load state. The address is received and the data is read from either the LUT or the PCM banks and sent to the host over several clock cycles of a burst read. The data is internally transferred to the read line buffer from the multi-line page buffers 52 or LUT during the burst read state.

Some accesses may read or write the command or mode registers. The command register state is entered for these accesses.

Flowcharts of Command Operations—FIGS. 10-14

Figure 10:
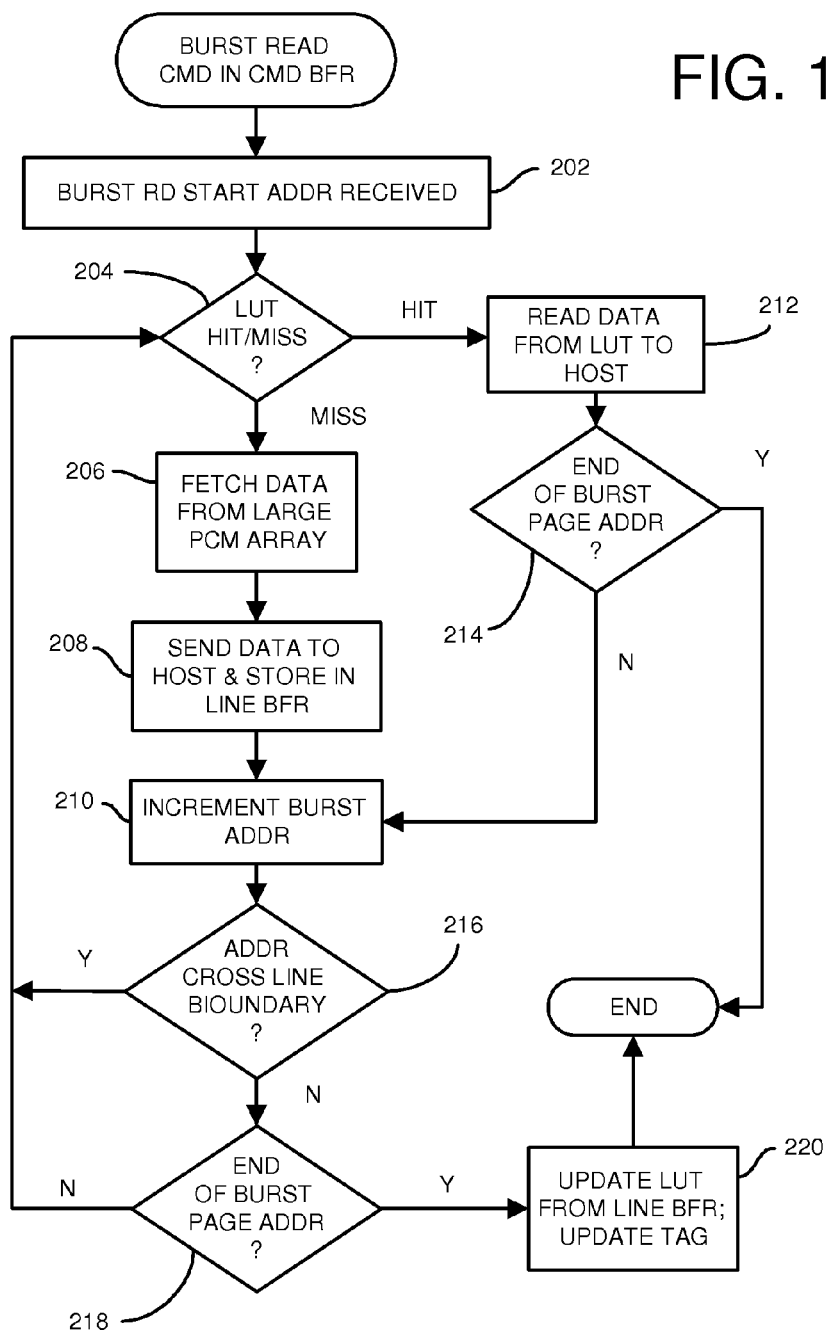
FIG. 10 is a flowchart of processing a burst read command by a page-mode PCM device.

FIG. 10 is a flowchart of processing a burst read command by a page-mode PCM device. A burst-read command is the next command to be processed in the command buffer. The burst read's start address is read from the mode register, step 202. A tag portion of the start address is compared to tags in the LUT, step 204, to determine if a hit or miss occurs in the LUT. Valid bits for LUT lines may also be examined with the tags.

When a hit occurs, step 204, then the data may be read directly from the LUT, step 212, and sent to the host, such as through the read line buffer. When the end of the burst page address is reached, step 214, the burst read command ends. When there is more data to be read in the burst, step 214, the burst address is incremented, step 210, and the current burst address is examined to see if a line boundary has been crossed, step 216. When the end of the burst has not been reached, step 218, or a line boundary has been crossed, step 216, then the current address in the burst sequence is again compared to the LUT tags, step 204, to re-determine if a hit or miss occurs for the next line or data in the burst.

When a LUT miss occurs, step 204, then the requested data is not in the LUT. The data is fetched from the PCM banks, step 206, and into the multi-line page buffers. The fetched data is sent to the host through the read line buffer, and to the LUT through the line buffer. The burst address is incremented, step 210. When the end of the burst has not been reached, step 218, or a line boundary has been crossed, step 216, then the current address in the burst sequence is again compared to the LUT tags, step 204, to re-determine if a hit or miss occurs for the next line or data in the burst.

Once the end of the burst is reached, step 218, then the fetched data is written from the line buffer into the LUT, step 220. The tags for this line in the LUT are also updated with the new address.

Figure 11:
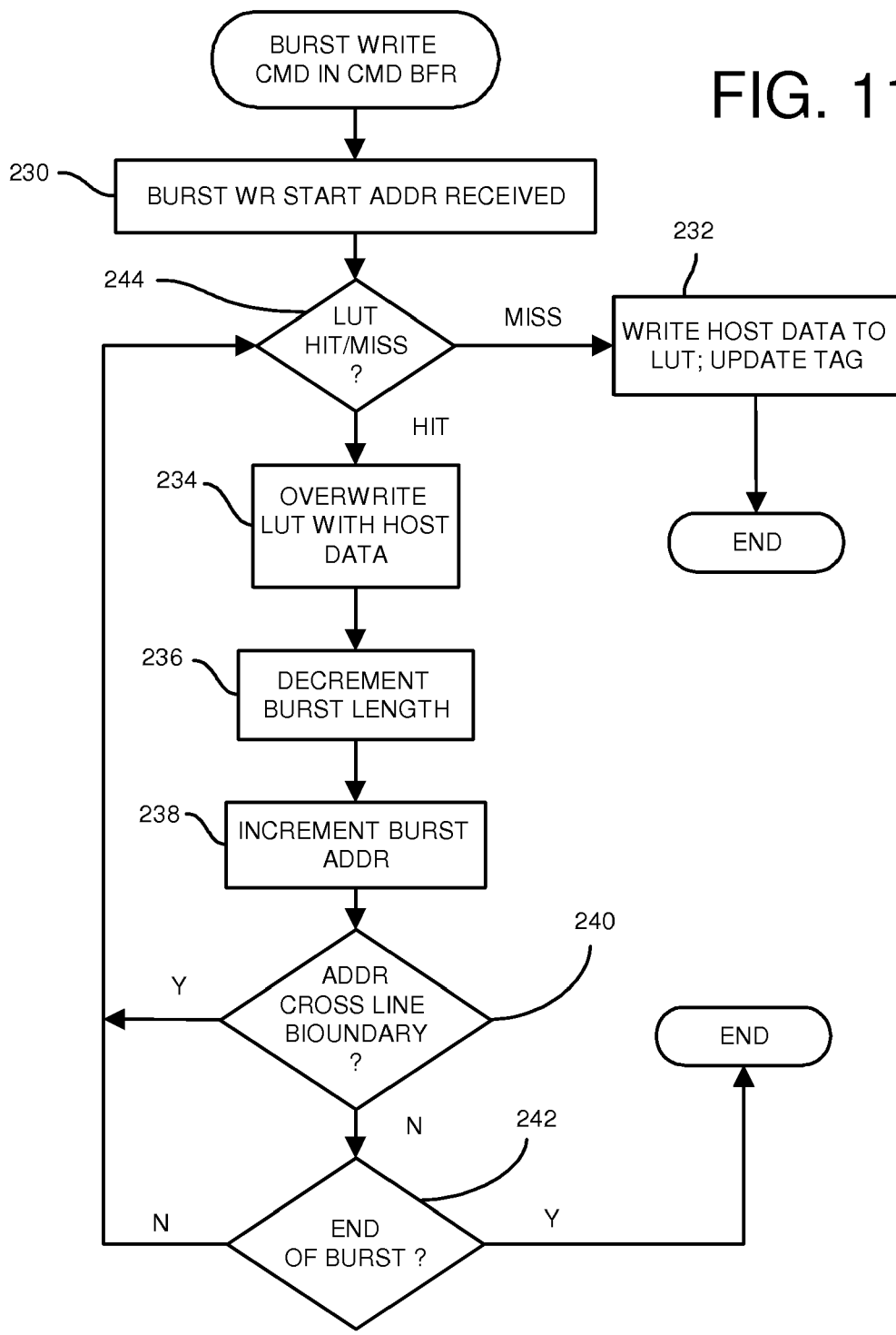
FIG. 11 is a flowchart of processing a burst write command by a page-mode PCM device.

FIG. 11 is a flowchart of processing a burst write command by a page-mode PCM device. A burst-write command is the next command to be processed in the command buffer. The burst write's start address is write from the mode register, step 232. A tag portion of the start address is compared to tags in the LUT, step 244, to determine if a hit or miss occurs in the LUT. Valid bits for LUT lines may also be examined with the tags.

When a miss occurs, step 244, then the host data may be written directly to the LUT from the write line buffer, step 232. The LUT tag is updated with the new host address. An empty line in the LUT may be allocated for this new host data.

When a LUT hit occurs, step 244, then the host data can over-write data already in the LUT, step 234. The burst address is incremented, step 238. When the line boundary has been crossed, step 240, or when the end of the burst has not yet been reached, step 242, then the current address in the burst sequence is again compared to the LUT tags, step 244, to re-determine if a hit or miss occurs for the next line or data in the burst.

Once the end of the burst is reached, step 242, then the burst write ends. The host data is stored only in the LUT, not in the PCM banks.

Figure 12:
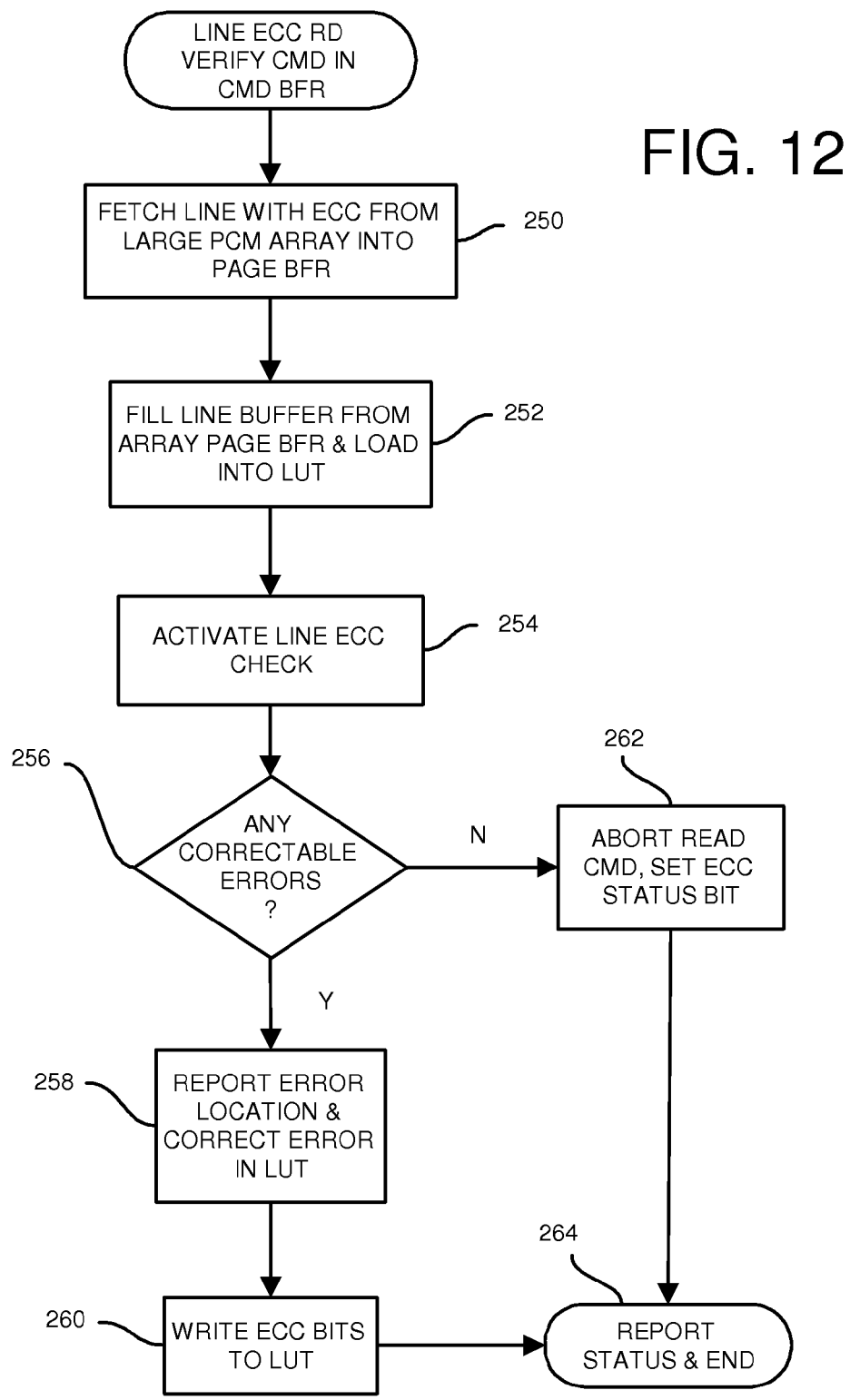
FIG. 12 is a flowchart of a line ECC read with verify operation.

FIG. 12 is a flowchart of a line ECC read with verify operation. This command specifies that error checking and correction be performed to verify the data being read from the PCM banks. When the next command in the command buffer is a line ECC read verify, the command's address is used to locate the line in the PCM banks. The line with both data and ECC bytes is read from the PCM banks and stored in the multi-line page buffers, step 250. The fetched data and ECC is transferred from multi-line page buffers 52 to line buffer 54 (FIG. 7) and then written into LUT 66, step 252.

The ECC controller is activated, step 254, to generate a syndrome from the data and ECC bytes of the fetched data from the PCM banks. When the ECC controller determines that there are no correctable errors, or no errors, step 265, then the read command ends and the ECC status is written to a status register, step 262. The ECC status bit can indicate when there were no errors, or when there were errors that were uncorrectable.

When there are correctable ECC errors, step 256, the location of the error bit or bits is determined from the syndrome, and correction is performed, step 258. The data in the LUT is read and corrected by the ECC controller and the corrected data is written back to the LUT, step 260. The ECC status can be reported as the command processing finishes, step 264.

Figure 13:
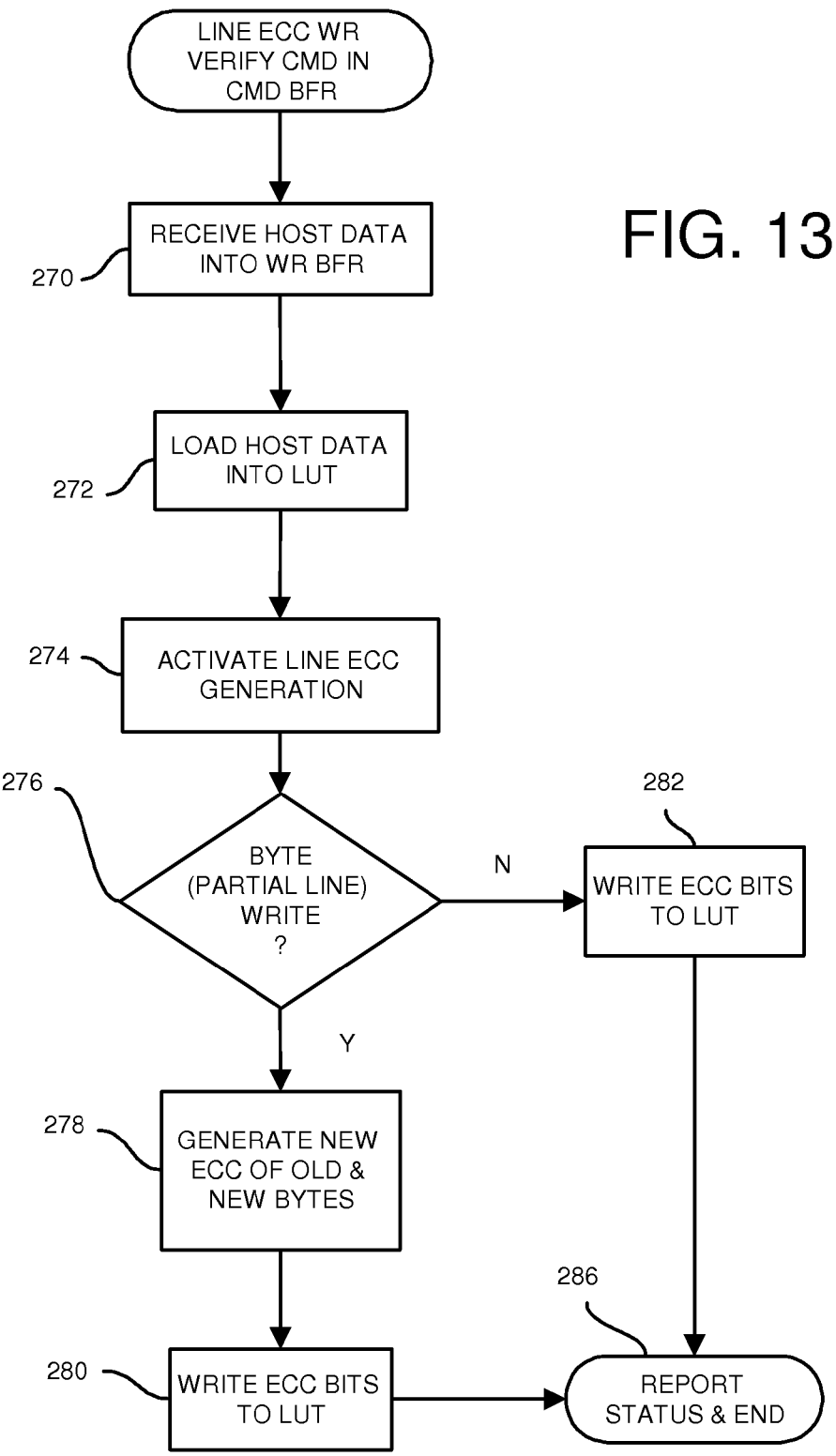
FIG. 13 is a flowchart of a line ECC write with verify operation.

FIG. 13 is a flowchart of a line ECC write with verify operation. This command specifies that error checking and correction be performed to verify the data being written into the PCM banks. When the next command in the command buffer is a line ECC write verify, the host data is latched into the write line buffer from a host data bus, step 270. The host data is written from the write line buffer into the LUT, step 272, and the tags are updated and an old line evicted from the LUT when necessary.

The ECC controller is activated, step 274, to generate ECC bytes for the host data in the LUT. The generated ECC bytes are stored with the host data in the line in the LUT. When the host writes data to all bytes in the line in the LUT, step 276, then no write merging is needed, and the generated ECC bytes are written to the LUT, step 282, and the command ends with the status reported, step 286.

When the host performs a partial write, writing some but not all bytes in the current line in the LUT, step 276, then new host data is merged with old data that is already in the LUT, or has just been fetched into the LUT. The ECC controller generates new ECC bytes for the merged line in the LUT that contains both new host bytes and old bytes, step 278. The new ECC bytes for the merged line in the LUT are written to this line in the LUT, step 280. The command ends with its status reported, step 286.

Figure 14:
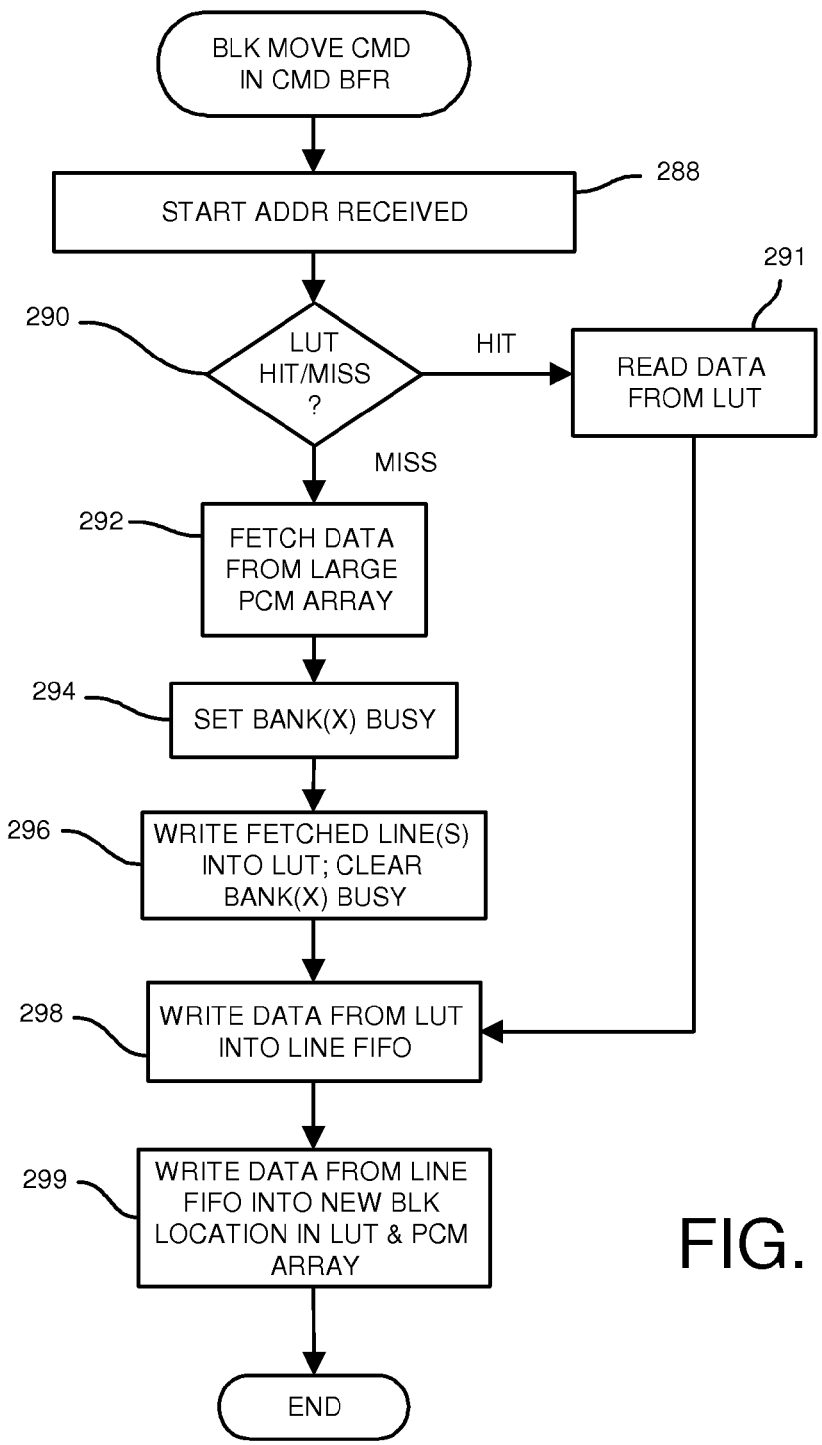
FIG. 14 is a flowchart of a block move command.

FIG. 14 is a flowchart of a block move command. Block move commands are defined to be aligned to line boundaries in one embodiment, allowing reduced checking for line crossings.

When the block move command is the next command to be processed in the command buffer, the start address is read from the mode register, step 288. The start address is compared to tags for lines in the LUT, step 290.

When a matching tag is found, step 290, then the data can be read from the LUT directly, step 291. The data from the starting address is read from the LUT and then written into the line FIFO at a different (target) address, step 298. The moved data in the line FIFO is then written into the LUT and also into the PCM banks, step 299, at the new target address. Writing to the PCM banks can be performed much later in time for a copy-back LUT, or more immediately for a write-through LUT.

When a matching tag is not found, step 290, then the data is not in the LUT. Instead, the data is read from the PCM banks into multi-line page buffers 52, step 292. A busy bit for the PCM bank may be set, step 294, to prevent access of the bank during the move operation. The fetched data from the PCM bank is transferred from multi-line page buffers 52 into the LUT, step 296, and the bank busy bit is cleared.

The data from the starting address is read from the fetched line just written into the LUT and then written into the line FIFO at a different (target) address, step 298. The moved data in the line FIFO is then written into the LUT and also into the PCM banks, step 299, at the new target address. Writing to the PCM banks can be performed much later in time for a copy-back LUT, or more immediately for a write-through LUT.

Alternate Embodiments

Several other embodiments are contemplated by the inventors. For example different numbers and arrangements of devices, banks, and buffers may be used, such as 32 banks, 64 banks, or 8 banks. Data lines may be wider, allowing multiple banks to be loaded at once. The page and line sizes may vary, and buffers may be various depths and widths. Additional buffers and registers for pipelining may be added, while some buffers may be bypassed or removed.

While ECC bytes have been described, the number of bits of ECC information does not have to be a multiple or 8 bits, but could be an arbitrary width. The LUT could be a PCM rather than a SRAM. Even though PCM writes are relatively slow, the smaller size of the LUT may improve performance.

The PCM device may support various operations such as Read (Random Byte read, Block read, page read, Buffered Page read), Program (Random Byte write, block write, page write, and buffered page write), Erase (Block erase, Page erase), Read Status, Read ID, Read PCM Type, Copy Back, and Reset command. ECC support may be provided in some embodiments but not in other embodiments.

Configurable features may include block size, page size, data bus width, PCM memory chip size, number of banks, interrupt enable, ECC functionality, copy back functionality, command configuration, number of address cycles (3 address-byte cycles can address up to 8 Gbit memory, for higher capacity, like 16-Gb or above, 4 address cycles may be needed), number of ID read and status read cycles, spare area usage definition, etc.

Addresses may be latched at the local banks in the local row decoder and local column decoder. The row decoder latches the row portion of the address, either before or after decoding, while the column decoder latches the column portion of the address, either before or after decoding. A bank enable may also be latched. Alternately, addresses may be latched outside of the PCM bank array. Sequential addresses could be internally generated or altered. Various burst orders of the data bytes and addresses may be used.

While an 8-bit data byte has been described, the data word could be other widths, such as 4 bits, 12 bits, 16 bits, or multiples of 8 bits, or other values. A data mux could be a mux with logic gates or transmission gates, or could use wired-OR logic or be a bus multiplexer that uses the data lines that are physically connected to several or all banks, and are controlled to connect each data byte to just one bank at a time. Time multiplexing may also be employed.

While a PCM chip with various internal functions has been described, some functions could be performed outside of the PCM chips, such as by a PCM controller, microcontroller, glue logic, bus controller, or other chips. Address translation or pre-decoding could also be performed. The PCM array could be on several chips rather than on one chip, or could be integrated with a larger system chip having other functions such as a processor.

The PCM cells can use select transistors in series with the variable resistor as shown, or additional transistors may be added, such as for a dual-port memory with 2 bit lines per cell, and two select transistors that connect to the same alloy resistor. The melting and crystalline temperatures may vary with the alloy composition and with other factors such as impurities. The shape and size of the alloy resistor may also affect these temperatures and set, reset time periods.

The terms set and reset can be applied to either binary logic state. For example, set can refer to changing to the logic 1 state for positive logic, or to changing to the logic 0 state for negative or inverse logic. Likewise, reset is to 0 for positive logic, but inverted logic can reset to 1, such as for active-low logic. Set and reset can also refer to remaining in the previous state, such as setting a cell that is already 1. One system can use both active-high and active-low logic domains, and logic can refer to the physical states of the memory cells, or the data read at the I/O of a memory chip, or at some other point.

Directional terms such as upper, lower, up, down, top, bottom, etc. are relative and changeable as devices are rotated, flipped over, etc. These terms are useful for describing the device but are not intended to be absolutes. Some embodiments may have chips or other components mounted on only one side of a circuit board, while other embodiments may have components mounted on both sides.

The address decoders may be included as part of a memory controller, microcontroller, serial engine, DMA, PCM memory controller, transaction manager, or other controllers. Functions can be implemented in a variety of ways. Some functions can be programmed and executed by a CPU or other processor, or can be implemented in dedicated hardware, firmware, or in some combination. Many partitioning of the functions can be substituted.

Components, controllers, and functions can be implemented in a variety of ways. Functions can be programmed and executed by a CPU or other processor, or can be implemented in dedicated hardware, firmware, or in some combination. Many partitioning of the functions can be substituted.

A standard flash, DRAM, or SRAM controller may be integrated with the PCM controller to allow for accessing these various kinds of memories. Various routines may contain instructions that are part of the operating system, basic input-output system (BIOS), manufacturer-specific routines, and higher-level application programs, and various combinations thereof. Various modified bus architectures may be used. Buses such as the local bus may have several segments isolated by buffers or other chips.

The phase-change memory has been described as having cells that each store one binary bit of data. However, multi-level cells (MLC) are contemplated wherein multiple logic levels are defined for different values of resistance of the alloy resistor. The architecture could be extended to other kinds of devices such as NAND flash memory devices.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A method for writing to a phase-change memory comprising:
   receiving from a host a burst write command including a host address and host data in a command buffer;

comparing a portion of the host address to a plurality of tags in a lookup table and for storing the host data in the lookup table when a tag in the plurality of tags matches the portion of the host address;

when the portion of the host address does not match any valid tag in the plurality of tags, allocating a new entry in the lookup table for the host address and storing the host data in the new entry;

copying the host data from the lookup table to the phase-change memory by storing a data word data as binary bits each represented by a chalcogenide glass layer having a melting point that is higher than a crystallization point, the chalcogenide glass layer forming a variable resistor that alters a sensing current when a binary bit is read; and representing a first binary logic state using a crystalline state of the variable resistor and representing a second binary logic state using an amorphous state of the variable resistor for binary bits stored in the phase-change memory.

2. The method for writing to the phase-change memory of claim 1 wherein copying the host data from the lookup table to the phase-change memory comprises first transferring the host data from the lookup table to a multi-line page buffer, and then transferring the host data from the multi-line page buffer to the phase-change memory;

whereby host write data is stored in the lookup table before writing to the phase-change memory.

3. The method for writing to the phase-change memory of claim 1 further comprising:

applying a set current for a set period of time to selected cells in the phase-change memory to set variable resistors into the crystalline state when the binary bits being written are in the first binary logic state; and applying a reset current for a reset period of time to the selected cells in the phase-change memory to reset variable resistors into the amorphous state when the binary bits being written are in the second binary logic state.

4. The method for writing to the phase-change memory of claim 3 wherein the reset current is at least twice the set current, and wherein the set current is at least twice a sensing current that passes through the variable resistor during a read operation;

wherein the set period of time is at least double the reset period of time, whereby the variable resistor is set by a lower current for a longer time period, and reset by a higher current and a shorter time period.

5. The method for writing to the phase-change memory of claim 4 wherein the set period of time is about 100 nanoseconds.

6. The method for writing to the phase-change memory of claim 1 further comprising:

generating error-correction code for host data stored in the lookup table; and checking and correcting errors in data read from the phase-change memory and stored in the lookup table using error-correction code stored in the phase-change memory, whereby error correction is performed for data in the lookup table.

7. The method for writing to the phase-change memory of claim 1 further comprising:

retaining data words stored in the phase-change memory when power is disconnected, wherein the alloy resistors remain in the amorphous state and remain in the crystalline state when power is disconnected;

whereby the data is stored in non-volatile memory.

8. The method for writing to the phase-change memory of claim 1 wherein the lookup table is a volatile memory, wherein lines of data words in the lookup table are lost when power is disconnected, while data words stored in the phase-change memory are retained when power is disconnected, whereby data is stored in non-volatile memory and cached in volatile memory.

9. The method for writing to the phase-change memory of claim 1 wherein the lookup table comprises a smaller array of the memory cells each having the alloy resistor, the alloy resistor storing binary data as solid phases each having a different resistivity, whereby the lookup table is non-volatile.

* * * * *